United States Patent [19]

Dafter, Jr.

[11] 4,035,500
[45] July 12, 1977

[54] METHOD OF DEPOSITING A METAL ON A SURFACE OF A SUBSTRATE

[75] Inventor: Robert Vincent Dafter, Jr., Ewing Township, Mercer County, N.J.

[73] Assignee: Western Electric Company, Inc., New York, N.Y.

[21] Appl. No.: 692,712

[22] Filed: June 4, 1976

[51] Int. Cl.$^2$ .................................... B05D 3/500
[52] U.S. Cl. ............................. 427/261; 427/256; 427/304; 427/305; 427/306; 427/337; 427/341; 427/343
[58] Field of Search .......................... 427/304–306, 427/337, 341, 343, 261, 256

[56] References Cited

U.S. PATENT DOCUMENTS

| 3,576,662 | 4/1971 | Diebold et al. | 427/305 |
| 3,709,727 | 1/1973 | Miller | 427/306 |
| 3,930,109 | 12/1975 | Brandt et al. | 427/305 |
| 3,950,570 | 4/1976 | Kenney | 427/305 |
| 3,956,041 | 5/1976 | Polichette | 427/304 |
| 3,956,535 | 5/1976 | Lozier | 427/305 |

Primary Examiner—Ronald H. Smith
Assistant Examiner—Janyce A. Bell
Attorney, Agent, or Firm—J. Rosenstock

[57] ABSTRACT

A method of depositing a metal on a surface of a substrate is disclosed. The method comprises forming a dielectric coat containing an activating metal species on the surface of the substrate. The coat is then treated with a reviving agent selected from chromic acid and ceric ammonium nitrate to revive the activating metal species to render the coat capable of participating in an electroless metal deposition.

6 Claims, No Drawings 4,035,500

METHOD OF DEPOSITING A METAL ON A SURFACE OF A SUBSTRATE

BACKGROUND OF THE INVENTION

1. Field of the Invention

This invention relates to a method of depositing a metal on a surface of a substrate and more particularly, to a method of depositng a metal on a surface of a substrate having an activating metal species distributed in at least a portion thereof.

2. Discussion of the Prior Art

The frequency of use of printed circuit boards has in recent times increased greatly. The advantages of such boards need not be enumerated because they are well known. Various methods for producing metallic patterns on substrates to produce the printed circuit boards are similarly well known. These methods include, alone or in various combinations, positive and negative printing processes, positive and negative silk screening processes, positive and negative etching techniques, electroplating and electroless plating.

Electroless plating has found great favor with many workers in the art. Generally speaking, electroless plating requires a so-called activation or catalization step during which a substrate surface, to be electrolessly plated with a metal has placed thereon a material, usually a metal salt. This metal salt is capable of reducing the plated metal from an electroless bath without the use of an electrical current. Catalization by such a material (called a "catalyst" or an "activator") is referred to as such because the materials used, usually the salts of the precious metals (palladium, platinum, gold, silver, iridium, osmium, ruthenium and rhodium) serve as reduction catalysts in an autocatalytic electroless plating process.

A problem with conventional electroless metal plating of hydrophobic surfaces, such as organic polymer surfaces, is that of adhesion of the metal deposit thereto. Techniques involving etching with acids and/or caustic of the surface prior to activation thereof have been employed with some success. Such etching however often leads to an undesirable amount of surface roughness. An alternative to this etching technique prior to activation is to incorporate and disperse an activating metal species such as palladium metal into the polymer surface either directly or through the use of an ink or resinous covering coat or layer. It has been found however that this incorporation does not lead to a continuous electroless metallization but on the contrary leads to a metallization having voids and more often than not, the incorporation leads to no metallization at all. The resultant voids or lack of metallization (partial or complete) has been hypothesized to be due to the postulated fact that the dispersed palladium species is encapsulated by the polymer and is thus rendered dormant and must then be revitalized or revived to its catalytic state such as by being uncovered or exposed. The revival may be accomplished with mixed success by abrading the polymer surface or etching the polymer surface with mineral acids, e.g., $H_2SO_4$, $HNO_3$. It has been found that this abrading and/or etching not only leads to a surface roughened to an undesirable degree but also to a surface which may not be completely revived, if at all.

An electroless metal deposition process wherein a catalytic species is distributed in at least a portion of the substrate to be metallized and which is subsequently rendered capable at a relatively rapid rate of participating in an electroless metal deposition catalysis without roughening of the surface is therefore desired.

SUMMARY OF THE INVENTION

This invention relates to a method of depositing a metal on a surface of a substrate and more particularly to a method of depositing a metal on a surface of a substrate having an activating metal species distributed in at least a portion thereof.

DETAILED DESCRIPTION

The present invention has been described primarily in terms of depositing copper on a surface of an insulative substrate. It will be readily appreciated that the inventive concept is equally applicable to depositing other suitable metals, which are catalytically reduced from their respective ions by catalytic activating metal species.

A suitable substrate is selected. For the production of electrical circuit patterns, suitable substrates are those which are generally nonconductive. In general, all dielectric materials are suitable substrates. Dielectric materials commonly employed comprise a resinous material. If desired, the resinous material may incorporate fibrous reinforcement. For instance, paper or cardboard, glass fiber or other fibrous material may be impregnated with a phenolic, epoxy or fluorohydrocarbon (e.g., polytetrafluoroethylene) resinous material and pressed or rolled to a uniform thickness. A top dielectric coat or layer comprising a suitable activating metal species distributed or dispersed therein is provided on the substrate. The suitable activating metal species is a species which serves as a reduction catalyst in an autocatalytic electroless plating. The catalytic activating metal species is one which can initially exist as (1) a catalytic atomic species, e.g., palladium metal, or (2) a catalytic ionic species, e.g., $Pd^{+2}$ ions, which is subsequently converted into a catalytic metal, as by reduction with a suitable reducing agent, e.g., $Sn^{+2}$, formaldehyde, hydrazine, etc. A suitable activating metal species includes a noble metal (Au, Ag, Ir, Pt, Pd, Rh, Os, Ru) and/or a salt thereof. Preferred activating metal species (metal or salts) include platinum, palladium, silver and gold. Typical salts include the halides, e.g., chlorides, bromides, etc., nitrates and hydroxides, of these activating metals.

Typically, the activating metal species, e.g., palladium metal, $PdCl_2$, is admixed or incorporated using any conventional technique with a suitable resin which in turn is destined to be applied to a surface of the substrate to form the activating metal species containing dielectric coat or layer in the form of an adhesive base, adhesive ink or other suitable composition form. The activating metal species is typically dispersed throughout the resin.

The amount of the activating metal species contained in or dispersed through the resin composition should be an amount sufficient to provide adequate catalytic nucleating sites on the top surface of the resultant dielectric layer or coat upon a destined treatment with a reviving agent, i.e., by an agent which revives the dispersed species into its catalytic state. By "adequate nucleating sites" is meant an adequate number of catalytic activating metal species which provide or lead to a uniform and continuous electroless metal deposit on a surface treated with an electroless metal deposition solution. Ordinarily, a small fraction, typically about one weight percent, of the catalytic activating metal species is admixed with the resinous material to form the desired resinous composition.

Suitable resins include thermoplastic resins, e.g., acrylics, cellulosics, polyethylene, etc.; thermoplastic resins, e.g., epoxy resins, polyesters, alkyl resins, etc.; and mixtures thereof.

The resultant resin mixture comprising the resin component and the dispersed activating metal species is applied to a surface of the substrate using any conventional technique known in the art to form the dielectric coat or layer. The resultant dielectric layer or coat is then treated as by heating, curing, etc., whereby (1) the resultant dielectric layer has dispersed therethrough the activating metal species and (2) the resultant dielectric layer is bonded to the surface of the substrate.

It is to be pointed out that the dielectric layer comprising the resin mixture may be preformed or premolded and then laminated to the substrate surface. Also, where dielectric resin materials are used for the resin layer, it is to be pointed out that the substrate may comprise a conductive material, e.g., steel, and thus be masked by the resultant dielectric layer.

Although the formation of an activating metal species dispersed in at least a top surface or layer of the substrate has been described above in terms of forming a discrete resin mixture layer or coat, it is to be understood that the invention is not to be restricted thereby. For example, the activating metal species, combined with a suitable solvent or a polymeric resin, may conveniently be used to impregnate a porous substrate such as paper, wood, glass cloth, finely divided clays and fillers, polyester fibers, etc. In this regard, the substrate may have dispersed through its entirety the activating metal species rather than in a distinct or discrete dielectric or resin layer, such as for example by admixing the activating metal species with a resin and then molding and curing the resin to form the substrate which could function as a printed circuit board.

Ordinarily, the activating metal species contained in the resultant resin layer is capable of participating in an electroless metal deposition catalysis, i.e., is capable of functioning as a reduction catalyst in an autocatalytic electroless process either initially as a catalytic metal or upon reduction thereto by a suitable reducing agent. However, it has been found that upon combination with the resin and dispersion or distribution therein, the activating metal species becomes dormant in the sense that upon direct exposure to a reducing agent and an electroless metal deposition solution a subsequent electroless metal deposit will not be obtained. In order to render the resultant dielectric or resin layer catalytic, a surface of the dielectric layer is exposed to or treated with a suitable revivng agent for a period of time, e.g., typically one to two minutes at 30°-60° C., to render the treated surface catalytic to an electroless metal deposition, i.e., to revive the activating metal species contained thereon or therein to its catalytic state. Suitable reviving agents include chromic acid ($CrO_3$ or $H_2CrO_4$) and ceric ammonium nitrate [$Ce(NO_3)_4 \cdot 2NH_4NO_3$]. The dielectric layer is treated with a solution of the reviving agent contained in water.

The concentration of the reviving agent contained in the treating solution is not critical and typically comprises 25 to 40 weight percent. The dielectric layer is treated with the reviving agent containing solution which is maintained at a temperature ranging from 25° C. to the boiling point of the particular solution employed. Typically, the treating solution is maintained at a temperature ranging from 30° C. to 60° C.

Surprisingly, the treated surface of the dielectric layer is not roughened, as microscopically determined, by the treatment with the reviving agent whereby the activating metal species contained thereon is revived or revitalized to act as an electroless metal deposition catalyst.

Upon treatment with the reviving agent, the surface of the resin layer is now rendered catalytic for electroless metal deposition. The treated surface of the dielectric layer may be water rinsed and then is treated, as for example by immersion in a suitable electroless metal deposition solution wherein sequentially (1) a catalytic activating species, e.g., Pd metal, is formed if not already present, and (2) an electroless metal ion, e.g., $Cu^{+2}$, is reduced to the metal, e.g., $Cu^o$, and catalytically deposited as a metal deposit on the surface.

A suitable electroless metal deposition solution comprises a metal ion, e.g., $Cu^{+2}$, which is catalytically reduced to its corresponding metal, e.g., $Cu^o$, by a suitable reducing agent, e.g., formaldehyde, in the presence of a catalytic activating metal. A suitable reducing agent is one which (1) is capable of reducing activating metal ions to catalytic palladium metal and (2) is capable of reducing the electroless metal ions to the corresponding electroless metal.

Alternatively, where activating metal ions are present on the surface of the dielectric layer, the surface may first be treated with a suitable reducing agent and then treated with electroless metal deposition solution.

Surprisingly and unexpectedly, treatment of the surface of the resultant dielectric layer with either chromic acid alone, i.e., without a mineral acid, e.g., $H_2SO_4$, or with ceric ammonium nitrate alone, leads to a revived dielectric layer surface upon which an electroless metal deposit is initiated and observed within minutes after exposure to the electroless metal deposition solution. This is surprising and unexpected in the light of the fact that etching the dielectric layer with a mixture of acids, such as $H_2SO_4$ and chromic acids does not lead to such electroless metal deposit initiation except after several hours of exposure to the electroless metal deposition solution, typically 3-4 hours. Where chromic acid or ceric ammonium nitrate are combined with mineral acids such as $H_2SO_4$, HCl, $HNO_3$, etc., the electroless metal deposition initiation rate is slowed and may even be prevented.

The electroless metal deposit may then be further built up by prolonged exposure to the electroless plating solution or by being electroplated in a standard electroplating bath.

It is to be noted that the various typical electroless and electroplating solutions and plating conditions and procedures are well known in the art and will not be elaborated herein. Reference in this regard is made to *Metallic Coating of Plastics*, William Goldie, Electrochemical Publications, 1968.

It is also to be noted that the invention disclosed herein may be employed for selective metallization in which by selectively treating portions of the surface of the resin layer with the reviving agent, a metal pattern is ultimately obtained. Conventional masking and lithographic techniques well known in the art may also be employed to obtain such metal patterns used for example in the production of electrical circuit patterns on a non-conductive substrate.

EXAMPLE I

A. For comparison purposes, a commerically obtained epoxy-glass substrate was selected. A mixture comprising (1) 100 parts by weight of an epoxy resin component, (2) 15 parts per 100 parts of the resin component of an elastomerically modified epoxy resin blend comprising a mixture of the diglycidyl ether of bisphenol A and the adduct of two moles of the diglycidyl ether of bisphenol A and one mole of a carboxyl terminated acrylonitrile-butadiene copolymer having the following structural formula

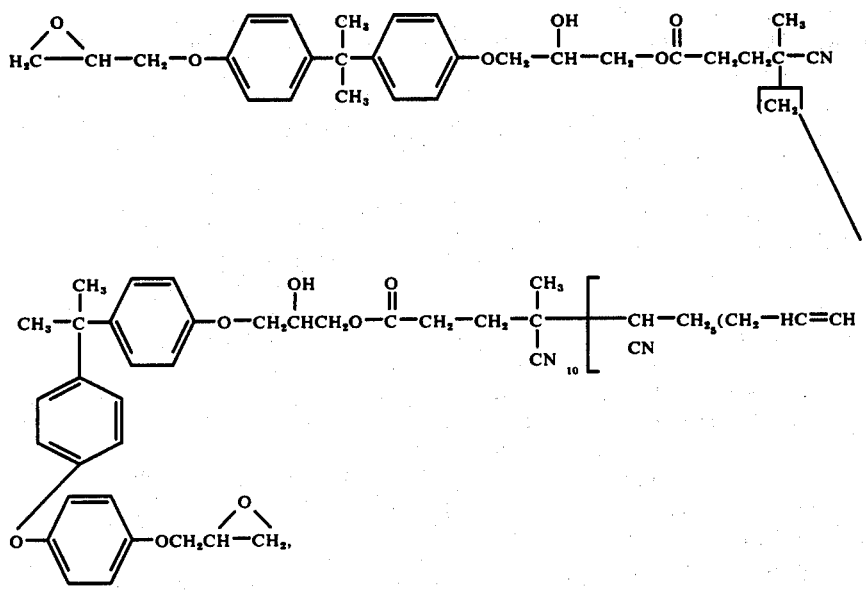

an epoxide equivalent weight of 335 to 355, a viscosity y-z (Gardner-Holdt, 8% N.V. in methyl cellulose [methoxy ethanol]), and an acid value of less than 0.2, (3) 25 parts of the maleic anhydride adduct of methyl cyclopentadiene (available commerically as "Nadic Methyl Anhydride"), (4) 15 parts by weight per 100 parts by weight of the resin component of chlorendic anhydride, (5) 1 part by weight per 100 parts by weight of the resin component of benzyl dimethylamine, (6) 4 parts by weight per 100 parts by weight of the resin component of malonic acid, (7) 0.5 parts by weight per 100 parts by weight of the resin component of $PdCl_2$, (8) 15 parts by weight per 100 parts by weight of the resin component of dimethylformamide and (9) 15 parts by weight per 100 parts by weight of the resin component of methyl cellosolve. The resin component comprised (a) 50 weight percent of a diglycidyl ether of bisphenol A having an epoxide weight of 650–750, a softening point of about 35° C. and a hydroxyl content of two hydroxyl groups/molecule, and (b) 50 weight percent of a diglycidyl ether of bisphenol A having an epoxide equivalent weight of 445–520, a softening point of about 35° C. and a hydroxyl content of two hydroxyl groups/molecule.

The resultant mixture was applied to a surface of the glass board and then cured at a temperature of 150° C. for 30 minutes whereby a cured resin layer was obtained on the surface of the substrate. The substrate was then immersed in an electroless metal plating bath comprising cupric sulfate, formaldehyde, complexer and caustic for 2–3 hours. An electroless metal deposit was not obtained on the cured resin layer.

EXAMPLE II

For comparison purposes, the procedure of Example I was repeated except that the surface was etched at 65° C. for 3 minutes with an aqueous solution comprising about 10 weight percent $H_2SO_4$. The surface was etched and roughened. An electroless metal deposit was not obtained on the cured resin layer.

EXAMPLE III

For comparison purposes, the procedure of Example I was repeated except that the surface was etched at 25° C. for about two minutes with an aqueous solution comprising about 15 weight percent of $NHO_3$. The surface was etched and roughened. An electroless metal deposit was not obtained on the cured resin layer.

EXAMPLE IV

For comparison purposes the procedure of Example III was repeated except that the surface was etched at 25° C. for 2–3 minutes with an aqueous solution comprising 68 weight percent $HNO_3$. Essentially the same results as in Example III were obtained.

EXAMPLE V

For comparison purposes, the procedure of Example I was repeated except that the surface was etched at 65° C. for about 2 minutes with an oxidizing aqueous solution comprising ferric chloride. The surface was etched and roughened. An electroless metal deposit was not obtained on the cured resin layer.

EXAMPLE VI

For comparison purposes, the procedure of Example I was repeated except that the surface was etched at 25° C. for 2 minutes with an aqueous solution comprising 10 weight percent $H_2SO_4$ and 25 weight percent $CrO_3$. After 15 minutes of immersion in the electroless metal plating bath, an electroless metal deposit was not obtained. Initiation of an electroless copper deposit was obtained after 2-4 hours of immersion in the electroless metal plating bath.

EXAMPLE VII

The procedure of Example VI was repeated except that the surface was treated with an aqueous solution comprising 25 weight percent $CrO_3$ at 25° C. for about 2-3 minutes. The surface was not roughened by the treatment. Within 15 minutes initiation of an electroless copper deposit was obtained.

EXAMPLE VIII

The procedure of Example VII was repeated except that the surface was treated with an aqueous solution comprising about 35 weight percent $CrO_3$. The surface was not roughened by the treatment. Within 15 minutes initiation of an electroless copper deposit was obtained.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of depositing a metal on a surface of a substrate, which comprises:
   a. forming a dielectric coat, containing an activating metal species selected from the group consisting of ($a^1$) a noble metal, ($b^1$) a salt of said nobel metal and ($c^1$) a mixture of ($a^1$) and ($b^1$), in an amount sufficient to provide adequate catalytic nucleating sites available for the production of a uniform and continuous electroless metal deposit on the surface; and
   b. treating said coat with a reviving agent selected from the group consisting of chromic acid and ceric ammonium nitrate to render said coat catalytic in an electroless metal deposition.

2. The method as defined in claim 1 which further comprises exposing said treated coat to an electroless metal deposition solution to deposit an electroless metal thereon.

3. A method of selectively depositing a metal pattern on a surface of a substrate, which comprises:
   a. forming a dielectric layer, comprising therein an activating metal species selected from the group consisting of ($a^1$) a nobel metal, ($b^1$) a salt of said noble metal and ($c^1$) a mixture of ($a^1$) and ($b^1$), in an amount sufficient to provide adequate catalytic nucleating sites available for the production of a uniform and continuous electroless metal deposit on the surface; and
   b. selectively treating portions of said layer with a reviving agent selected from the group consisting of chromic acid and ceric ammonium nitrate to delineate a pattern, corresponding to the desired metal pattern, rendering said pattern catalytic to an electroless metal deposition.

4. The method as defined in claim 3 which further comprises exposing said selectively treated layer to an electroless metal deposition solution to deposit an electroless metal thereon.

5. A method of depositing a metal on a surface of a dielectric body, which comprises:
   a. distributing an activating metal species selected from the group consisting of ($a^1$), a noble metal, ($b^1$) a salt of said noble metal and ($c^1$) a mixture of ($a^1$) and ($b^1$), within the body at least proximate to the surface in an amount sufficient to provide adequate catalytic nucleating sites available for the production of a uniform and continuous electroless metal deposit; and
   b. treating the surface of said distributed species body with a reviving agent selected from the group consisting of chromic acid and ceric ammonium nitrate to revive said activating metal species to its catalytic state, wherein said distributing or said treating steps are directed to at least a portion of the surface.

6. The method as defined in claim 5 which further comprises exposing said treated surface to an electroless metal deposition solution to deposit an electroless metal deposit on said at least a portion of the surface.

* * * * *

UNITED STATES PATENT OFFICE
CERTIFICATE OF CORRECTION

Patent No. 4,035,500      Dated July 12, 1977

Inventor(s) Robert V. Dafter, Jr.

It is certified that error appears in the above-identified patent and that said Letters Patent are hereby corrected as shown below:

In the specification, Column 3, line 56, "revivng" should read --reviving--. Columns 5 and 6, lines 15 through 38, the formula

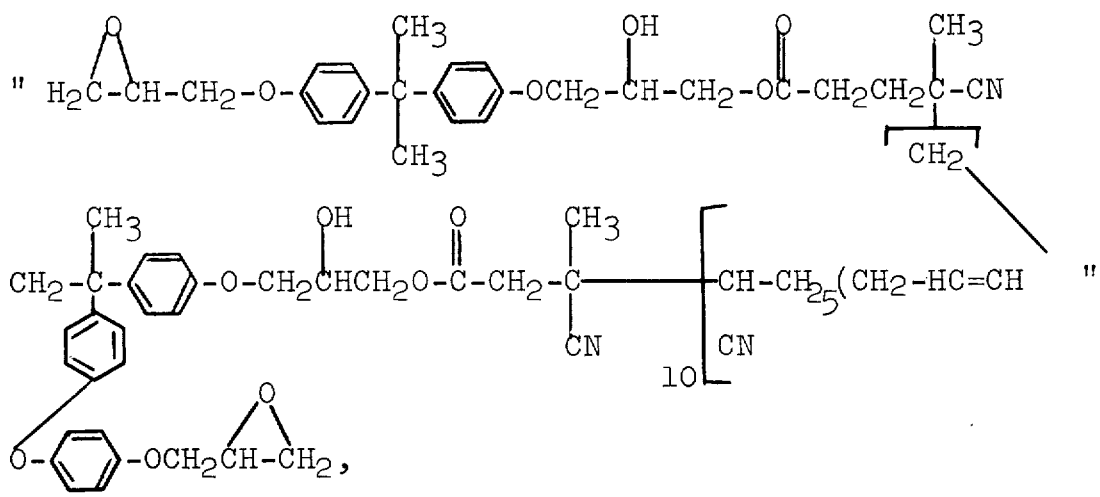

should read as follows:

UNITED STATES PATENT OFFICE
CERTIFICATE OF CORRECTION

Patent No. 4,035,500    Dated July 12, 1977

Inventor(s) Robert V. Dafter, Jr.

It is certified that error appears in the above-identified patent and that said Letters Patent are hereby corrected as shown below:

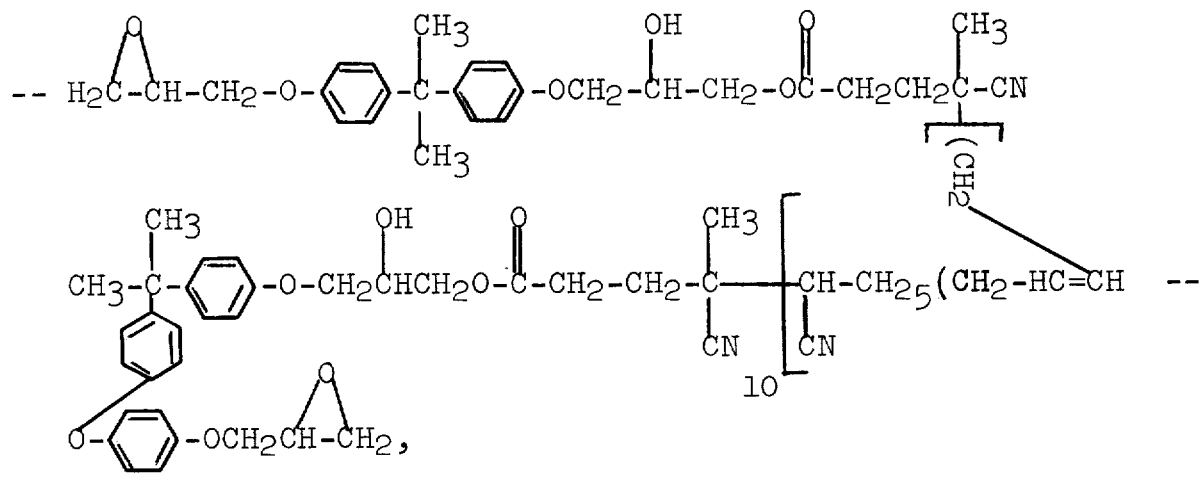

Column 5, line 56, "epoxide weight" should read --epoxide equivalent weight--. Column 6, line 41, "NHO₃" should read --HNO₃--.

In the claims, Column 7, claim 1, line 32, "nobel" should read --noble--. Column 8, claim 3, line 7, "nobel" should read --noble--.

Signed and Sealed this

Eighth Day of November 1977

[SEAL]

Attest:

RUTH C. MASON
*Attesting Officer*

LUTRELLE F. PARKER
*Acting Commissioner of Patents and Trademarks*